United States Patent [19]

Main

[11] Patent Number: 4,468,718
[45] Date of Patent: Aug. 28, 1984

[54] ENCLOSURE AND MOUNTING MEMBER FOR PRINTED CIRCUIT BOARDS

[75] Inventor: John E. Main, Lynchburg, Va.

[73] Assignee: General Electric Company, Lynchburg, Va.

[21] Appl. No.: 367,877

[22] Filed: Apr. 13, 1982

[51] Int. Cl.³ .............................................. H05K 5/03
[52] U.S. Cl. .................................. 361/399; 361/394; 361/412; 361/415
[58] Field of Search ............... 361/415, 399, 394, 395, 361/412, 413

[56] References Cited

U.S. PATENT DOCUMENTS

| | | | |
|---|---|---|---|
| 2,796,559 | 6/1957 | Feucht | 361/412 |
| 3,082,356 | 3/1983 | Lovell et al. | 361/399 |
| 3,258,649 | 6/1966 | Arguin et al. | 317/101 |
| 3,553,532 | 1/1971 | Cheshire | 317/100 |
| 3,932,016 | 1/1976 | Ammenheuser | 339/65 |
| 4,063,788 | 12/1977 | Latasiewicz et al. | 361/395 X |
| 4,091,440 | 5/1978 | Gelin et al. | 361/415 |
| 4,109,294 | 8/1978 | Mason et al. | 361/399 |
| 4,161,017 | 7/1979 | Pierce et al. | 361/412 |
| 4,251,853 | 2/1981 | Sites | 361/415 X |
| 4,295,180 | 10/1981 | Herron et al. | 361/399 X |
| 4,349,237 | 9/1982 | Cobaugh et al. | 361/415 X |
| 4,384,368 | 5/1983 | Rosenfeldt et al. | 361/412 X |

FOREIGN PATENT DOCUMENTS 613907 12/1960 Italy .................................... 361/415

Primary Examiner—R. R. Kucia
Attorney, Agent, or Firm—Cushman, Darby & Cushman

[57] ABSTRACT

An enclosure and mounting member for printed circuit boards has a first housing member defining the outer front of the enclosure and may have an aperture therein for exposing a front control panel. A second housing member defines the outer rear surface of the enclosure. A front control panel and each of the printed circuit boards held within the enclosure have irregularities such as shallow recesses in opposite outer edges. At least two mounting members are provided, each having a stem portion connectable to the first housing member and a flange portion extending perpendicularly from the stem portion connectable to the second housing member. The stem portions each have spaced irregularities such as pairs of notches which are congruent with and/or otherwise mated to respectively corresponding irregularities of the front panel and each of the printed circuit boards. The irregularities of the mounting members cooperate with the mated irregularities of the front control panel and the printed circuit boards for holding the front control panel and the printed circuit boards in substantially parallel, spaced, planes.

34 Claims, 5 Drawing Figures

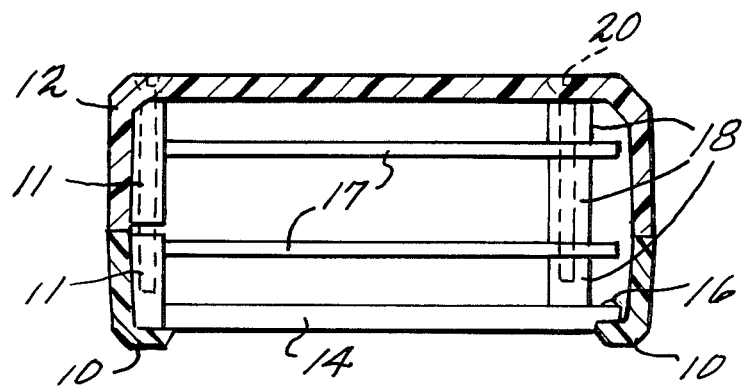
FIG. I
(PRIOR ART)
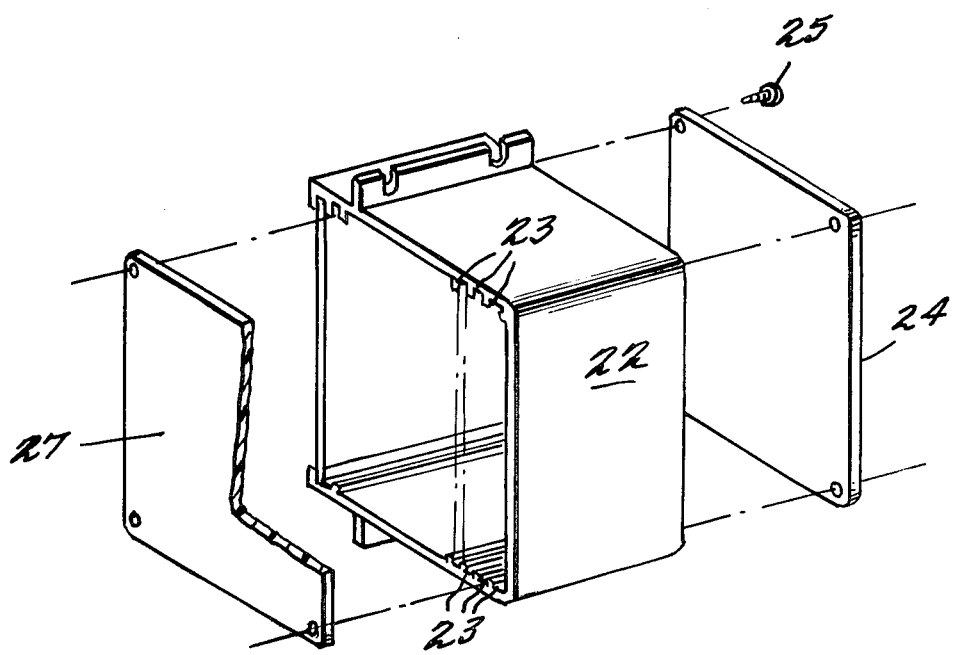
FIG. 2
(PRIOR ART)

ENCLOSURE AND MOUNTING MEMBER FOR PRINTED CIRCUIT BOARDS

BACKGROUND OF THE INVENTION

The present invention is related generally to enclosures for printed circuit boards.

The proliferation of printed circuit boards is electrical devices has resulted in the availability of a wide variety of enclosures for printed circuit boards. Since printed circuit boards are often used in mass produced consumer goods such as clocks, radios, etc., it is extremely important to have an enclosure which is both easy to assemble and inexpensive as well as providing adequate physical protection and separation between plural boards and the housing and other necessary functional features. The present invention is for such an enclosure.

There are currently a wide variety of enclosures for printed circuit boards known in the art. Such enclosures may be passive, i.e., merely holding the circuit board in the proper position, or active, i.e., providing electrical connections with the circuit board in addition to holding the circuit board in the proper position. A typical passive enclosure is shown in FIG. 1.

In FIG. 1 an enclosure has a front housing member 10 and rear housing member 12 each provided with integrally molded bosses 11. The front housing member and the rear housing member are typically held together by a screw, not shown. A front panel 14 may be integrally molded with the front housing member 10 or may be a separate member held in place by a screw 16 as is commonly provided when the front panel 14 carries control switches or the like. Printed circuit boards 17 are typically held in place by the combination of tubular spacers 18 and a screw 20 extended through holes in the circuit boards 17. The enclosure shown in FIG. 1 is particularly advantageous when it is necessary to service the printed circuit boards 17. By removing the screw holding the rear housing member 12 to the front housing member 10, the planar surface of the circuit board 17 is exposed.

However, the tubular spacers 18 require valuable space on the surface of the circuit boards which could otherwise be used for electrical components. Additionally, production errors in locating the hole for the screw 20 in the circuit boards 17 and assembly errors in lining up the tubular spacers 18 are cumulative. It is also possible to use the wrong length of spacer between given boards and/or the housing so a to result in improper spacing. This arrangement also requires a relatively large number of manual assembly steps. Thus, the enclosure shown in FIG. 1 is not well suited for accurately mounting a large number of printed circuit boards.

A second type of prior art enclosure is illustrated in FIG. 2. In FIG. 2, a central housing portion 22 is provided with pairs of opposing grooves 23 for holding the printed circuit boards. The central housing portion 22 may be integrally molded or molded in several pieces which are subsequently connected. The enclosure has a rear housing member 24 which may be intergrally molded with the central housing portion 22 or connected thereto by screws 25 or the like. The enclosure is completed by a front housing member 27 which is typically connected by screws, not shown. The enclosure illustrated in FIG. 2 may be an active enclosure by providing appropriate connectors in the rear housing member 24 adapted to receive edge connectors on the circuit boards.

Although the enclosure illustrated in FIG. 2 is well suited for holding a plurality of printed circuit boards and requires a minimum of surface area, it is not particularly well suited in applications where it is desirable to remove one of the housing members to expose the planar surface of the circuit board for servicing.

SUMMARY OF THE PRESENT INVENTION

The present invention is for an enclosure and mounting member for printed circuit boards which is easy to accurately assemble, requires a minimum of surface area of the circuit boards for mounting and provides easy access to the circuit boards. A first housing member defines the outer front edges of the enclosure and may include an aperture therein for exposing a front control panel. A second housing member defines the outer rear edges and may include the rear surface of the enclosure. The front control panel (if provided as a separate structure) and each of the printed circuit boards has irregularities such as shallow recesses in opposite outer edges thereof.

At least two mounting members are provided, each having a stem portion and a flange portion extending perpendicularly therefrom. The stem portions have spaced irregularities such as pairs of notches which are congruent with the irregularities of the front control panel and each of the printed circuit boards. The irregularities of the mounting members cooperate with the irregularities of the front control panel (if provided as a separate structure) and the printed circuit boards such that the front control panel and the printed circuit boards are held in substantially parallel, spaced planes.

The stem portion of each of the mounting members is provided with means, such as a threaded hole adapted to receive a screw or bolt, for attaching the mounting members to the first housing member. The flange portion of each of the mounting members is provided with means, such as a threaded hole adapted to receive a screw or bolt, for attaching the second housing member to the mounting members thereby completing the enclosure.

The enclosure and mounting members of the present invention cooperate to hold the printed circuit boards while utilizing a minimum of usable surface area of each circuit board. The second housing member can be easily removed thus exposing the planer surface of the circuit board for maintenance or repair work. Any number of circuit boards can be held by simply extending the length of the stem portion of the mounting members and providing the necessary mated sets of irregularities. Thus, additional circuit boards can be enclosed without the need for additional parts thereby simplifying the task of assembly and reducing the cost. These and other advantages will be apparent from the description of the preferred embodiment.

BRIEF DESCRIPTION OF THE DRAWING

FIGS. 1 and 2 illustrate prior art printed circuit board enclosures;

DESCRIPTION OF THE PREFERRED EMBODIMENT

Figure 3:
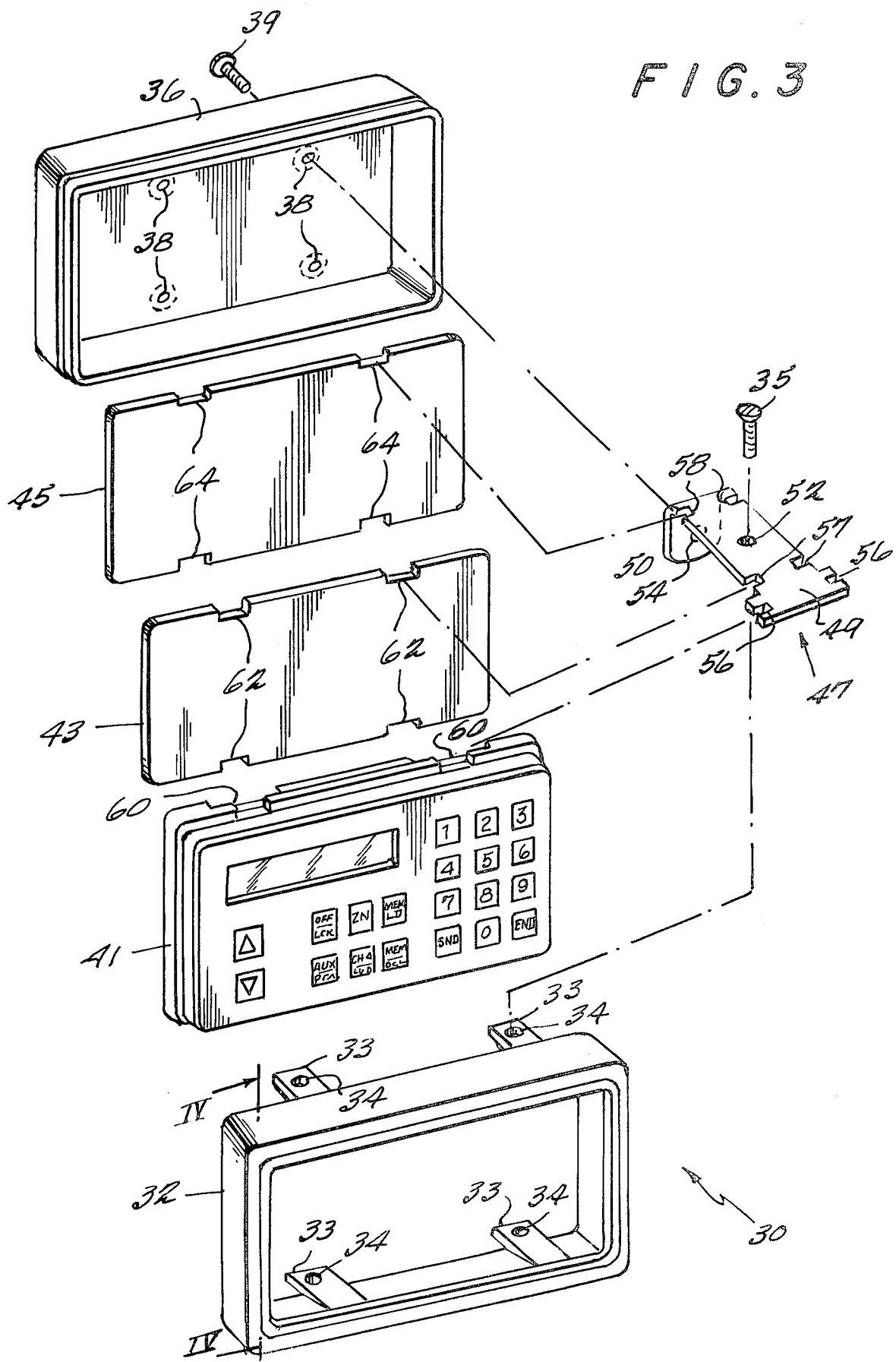
FIG. 3 is an exploded, perspective view of an exemplary printed circuit board enclosure including an exemplary mounting member of the present invention.
Figure 4:
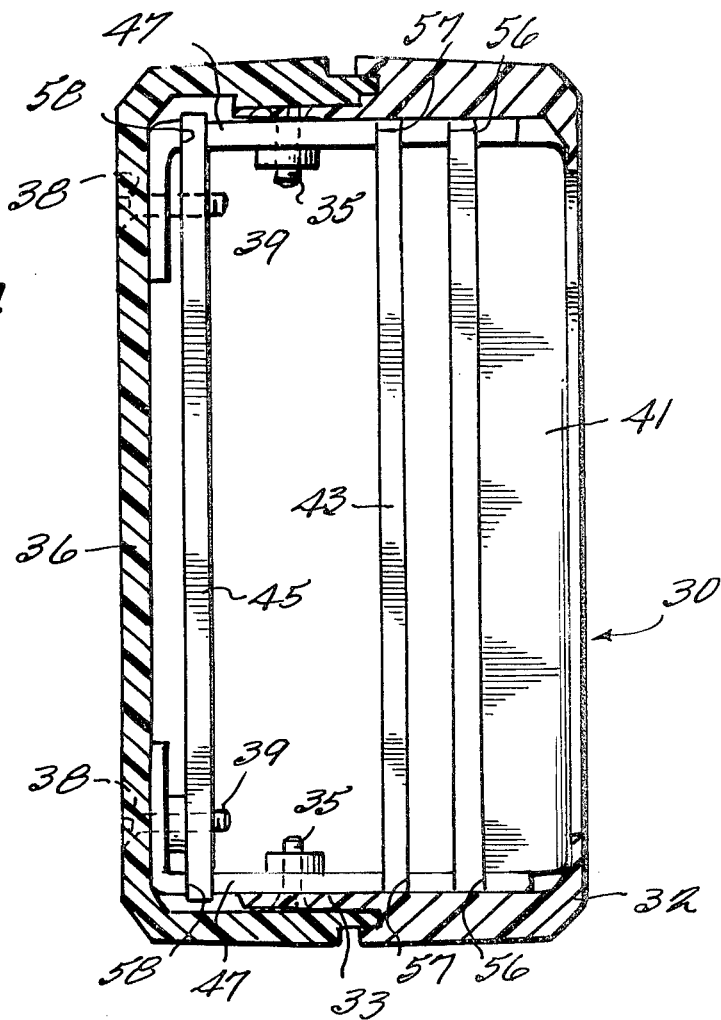
FIG. 4 illustrates the printed circuit board enclosure of the present invention, along the lines IV in FIG. 3.

An exemplary printed circuit board enclosure 30 constructed according to the teachings of the present invention is illustrated in FIGS. 3 and 4. A front or first housing member 32 defines the outer front edges of the enclosure and, in this exemplary embodiment, has an aperture therein through which a front control panel 41 is visible. The first housing member 32 has four projections 33 each having an opening 34 extending therethrough. The openings 34 are adapted to receive a fastening means such as a screw 35 or bolt.

A rear or second housing member 36 defines the outer rear edges and the rear surface of the enclosure 30. The rear housing member 36 has a plurality of openings 38 therethrough adapted for receiving a fastening means such as a screw 39 or bolt.

The front control panel 41 which defines the front surface of the enclosure 30 is shown in detail in FIG. 3. The front control panel 41 is typically provided with a plurality of control switches and a display or the like depending upon the nature of the electrical device which the enclosure 30 is provided with. The front housing member 32, the front control panel 41 and the rear housing member 36 cooperate to define the enclosure 30. Those skilled in the art will recognize that there may be occasions when the front control panel 41 is intergrally molded with the first housing member 32.

The enclosure 30 in this embodiment is adapted to carry a first printed circuit board 43 and a second printed circuit board 45. An important feature of the present invention is a mounting member 47 shown in detail in FIG. 5. A plurality of mounting members 47, four in this embodiment, cooperate to hold the front control panel 41, the first printed circuit board 43 and the second printed circuit board 45 in spaced, substantially parallel planes. The mounting members 47 are connectable to the first housing member 32 and the second housing member 36 such that the first and second printed circuit boards 43 and 45 are completely enclosed.

Each of the mounting members 47 has a stem portion 49 and a flange portion 50 extending perpendicularly therefrom as illustrated in FIG. 3. The stem portion 49 has a threaded opening 52 therein congruent with the opening 34 in the projections 33 of the first housing member 32. The threaded opening 52 in the stem portion 49 of the mounting member 47 is adapted to receive the screw 35, or other fastening means, such that the mounting member 47 may be rigidly fastened to the first housing member 32. In certain situations, it may be desirable to integrally mold the mounting members 47 with the first housing member 32.

The flange portion 50 of the mounting member 47 has a similar threaded opening 54 adapted to receive the screw 39, or other mounting means, such that the second housing member 36 may be connected to the mounting member. When the four mounting members 47 are each connected to the front housing member 32 by means of the screws 35 and the rear housing member 36 by the screws 39 the enclosure, except for the front control panel 41, is substantially complete.

Figure 5:
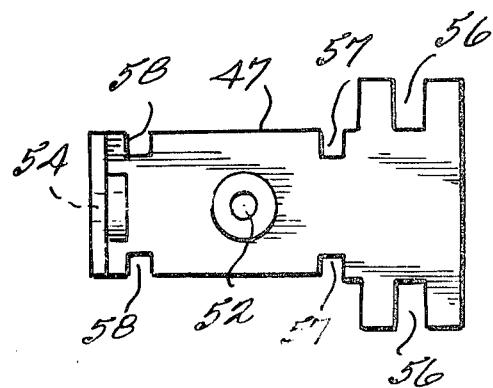
FIG. 5 illustrates the exemplary mounting member of the present invention.

As shown in FIG. 5, each of the mounting members 47 has a first pair of irregularities 56, a second pair of irregularities 57 and a third pair of irregularities 58 on the stem portion 49. In this embodiment, the pairs of irregularities 56, 57 and 58 comprise notches in the width of the stem portion 49.

The front control panel 41 has four irregularities 60, one for each of the pairs of the mating congruent irregularities 56 on each of the mounting members 47. The irregularities 60 of the front control panel 41 are shallow recesses, the length of which recesses are substantially equal to the width of the stem portion at the notched area 56. Thus, the shallow recesses 60 of the front control panel 41 cooperate with the notched irregularities 56 of each of the mounting members 47 such that the front control panel 41 is held in the proper position with respect to the first housing member 32.

In a similar fashion, the first printed circuit board 43 is provided with four irregularities 62. The irregularities 62 are congruent with the irregularities 57 of the mounting member 47. In this embodiment, the irregularities 62 are shallow recesses the length of which is substantially equal to the width of the stem portion 49 of the mounting member 47 in the area of the notches 57. The irregularities 62 of the first printed circuit board 43 cooperate with the congruent irregularities 57 of the four mounting members 47 such that the first printed circuit board 43 is held in a plane substantially parallel to, and spaced from, the plane defined by the front control panel 41.

The second printed circuit board 45 has irregularities 64 which cooperate with the congruent irregularities 58 of the four mounting members 47 such that the second printed circuit board 45 is held in a plane parallel to, and spaced from, the plane defined by the first printed circuit board 43. Thus, by use of the mounting members 47 the circuit boards 43 and 45 and the front control panel 41 are held in the proper relationship within the enclosure 30.

During assembly of the enclosure 30, the front control panel 41, the first printed circuit board 43 and the second printed circuit board 45 are held in the proper spaced, planar relationship by the mounting members 47. The front housing member 32 is inserted over the front control panel 41 and the first printed circuit 43 and is fastened to the mounting member 47 by means of screws 35. The rear housing member is inserted over the second printed circuit board 45 and fastened to the mounting members 47 by means of screws 39. In this manner, the housing 30 is completed and the printed circuit boards 43 and 45 are held in the proper relationship. It should also be noted that screws 35 are not visible in the completed assembly. Because the printed circuit boards 43 and 45 are held by pairs of irregularities positioned on opposite edges of the circuit board very little surface area of the surface board is utilized for mounting. Additionally, that surface area of the printed circuit boards which is utilized for mounting is on the very edge of the circuit board and not typically utilized for electrical components.

Another advantage of the present invention is that any number of circuit boards may be held by simply extending the length of the stem portion 49 of the mounting members 47 and providing the necessary mated or congruent irregularities. This is a substantial advantage since increasing the number of printed circuit boards to be enclosed does not increase the number of mounting members. Further, because all of the circuit boards are held by the same mounting members, the circuit boards may be more accurately positioned because each of the irregularities is cut into the same mounting member. These benefits combine to provide an enclosure which is extremely easy to assembly thereby reducing assembly time and ultimately reducing the cost.

Those skilled in the art will recognize that several variations of the preferred embodiment disclosed above are possible. For example, the irregularities in the front control panel 41, the first and second printed circuit boards 43 and 45 could be small pins or projections which cooperate with holes in the mounting members 47. Alternately, three pairs of tabs having irregularities such as the irregularity 56 could be provided on the stem of the mounting member 47. The tabs could then be bent at a 90° angle so as to grip the front control panel 41 and the first and second printed circuit boards 43 and 45 without the need to provide any congruent irregularities on these members. Thus, the description of the preferred embodiment is intended to be illustrative and not a limitation.

What is claimed is:

1. An enclosure for an electrical device having at least one printed circuit board, comprising:
   first and second housing members cooperating to define the enclosure for the electrical device;
   at least two mounting members for joining said first and second housing members by providing rigid support thereto and holding said printed circuit board at a predetermined position between said first and second housing members, each mounting member extended from said first housing member and including means adapted to cooperate with means associated with said circuit board for holding said circuit board at said predetermined position; and
   means for attaching said second housing member to said mounting members wherein the width of the mounting members include notched tabs therealong, the length of which notches are substantially the same as the thickness of the circuit board.

2. An enclosure as in claim 1 wherein the mounting members are at least in part integrally formed with said first housing member.

3. An enclosure as in claim 1 wherein the mounting members include individually formed mounting members and further include means for attaching said individually formed mounting members to said first housing member.

4. An enclosure as in claim 1 wherein the mounting members include notches along their widths, the length of which notches are substantially the same as the thickness of the circuit board, and wherein the circuit board includes shallow recesses the length of which are substantially the same as said notched width of said mounting members, and wherein the notches of the mounting members cooperate with the shallow recesses of the circuit board to hold said circuit board in the predetermined position.

5. An enclosure as in claim 1 or 4 wherein the notches of the mounting members are located such that the circuit board is spaced from both the first and second housing members.

6. An enclosure as in claim 5 wherein the mounting members have a plurality of notches for holding a plurality of circuit boards in a predetermined spaced relationship.

7. An enclosure for an electrical device having at least one printed circuit board, comprising:
   first and second housing members cooperating to define the enclosure for the electrical device;
   at least two mounting members for joining said first and second housing members by providing rigid support thereto and holding said printed circuit board at a predetermined position between said first and second housing members, each mounting member extended from said first housing member and including means adapted to cooperate with means associated with said circuit board for holding said circuit board at said predetermined position; and
   means for attaching said second housing member to said mounting members wherein the mounting members include L-shaped mounting members having a stem portion extending from the first housing member and a flange portion having a threaded hole for cooperating with the means for attaching said second housing member for securing said second housing member to said flange portion.

8. Apparatus for mounting and enclosing an electrical printed circuit board behind a front control panel, said apparatus comprising:
   a front control panel having first irregularities in opposite outer edges thereof;
   a printed circuit board having second irregularities in opposite outer edges thereof;
   a front housing member defining the front of a printed circuit board enclosure and having an aperture therein for exposing said front control panel;
   a back housing member defining the outer rear surface of said enclosure;
   at least two mounting members for joining said front and back housing members by providing rigid support thereto and holding said printed circuit board at a predetermined position between said front and back housing members, each such mounting member including spaced irregularities which are mated to said first and second irregularities, respectively;
   said mated irregularities on said mounting members, control panel and printed circuit board being in respective mutual contact so as to define substantially parallel planes for said front control panel and said printed circuit board, and
   means for securing said mounting members to said front and back housing members.

9. Apparatus as in claim 8 wherein each said mounting member comprises an elongated main body portion having spaced irregularities formed therealong.

10. Apparatus as in claim 9 wherein said main body portion comprises a substantially rectangular body of metal having pairs of opposing notches formed in its outer edges at locations spaced therealong.

11. Apparatus as in claim 9 or 10 wherein said means for securing comprises two threaded apertures in each mounting member.

12. Apparatus as in claim 11 wherein said elongated main body portion includes a right-angle bent section at one end, wherein one of said threaded apertures is located within said main body portion between said spaced irregularities and wherein another of said threaded apertures is located in said right-angle bent section.

13. A mounting apparatus according to claim 8 wherein each mounting member comprises:
   an elongated main body portion having spaced-apart irregularities formed therealong and designed to mate with irregularities in the outer edges of said electrical circuit boards, and attachment means for physically securing said main body portion to said outer enclosure.

14. A mounting apparatus as in claim 13 wherein said main body portion comprises a substantially rectangular body of metal having pairs of opposing notches formed in outer edges thereof at locations spaced therealong.

15. A mounting apparatus as in claim 13 or 14 wherein said attachment means comprises two threaded apertures.

16. A mounting apparatus as in claim 15 wherein said elongated main body portion includes a right angle bent section at one end, wherein one of said threaded apertures is located within said main body portion between said spaced-apart irregularities and wherein another of said threaded apertures is located in said right-angle bent section.

17. A mounting apparatus according to claim 8 wherein each mounting member comprises:
a stem portion dimensioned to be secured to and extend from the first housing member, the width of the stem portion having notched tabs therealong, the length of which notches are substantially the same as the thickness of the circuit board, said notches of said tab cooperating with said circuit board for holding said circuit board in a predetermined position; and
a flange portion extending perpendicularly from said stem portion for attachment to said second housing member.

18. A mounting apparatus according to claim 8 wherein each mounting member comprises:
a stem portion dimensioned to be secured to and extend from the first housing member, the width of the stem portion having notches therealong, the length of which notches are substantially the same as the thickness of the circuit board, said notches of said stem portion cooperating with the notches of said printed circuit board, the length of which notches is substantially equal to the notched width of said stem for holding said circuit board in a predetermined position; and
a flange portion extending at an angle from said stem portion for attachment to said second housing member.

19. A mounting apparatus as in claim 17 or 18 wherein the flange portion includes a threaded hole for facilitating the attachment of the second housing member.

20. A mounting apparatus as in claim 17 or 18 wherein the stem portion includes a threaded hole for facilitating attachment to the first housing member.

21. A mounting member as in claim 17 or 18 including a plurality of pairs of notches spaced apart along said stem for holding a plurality of circuit boards in a predetermined spaced relationship.

22. A mounting member as in claim 17 or 18 wherein said mounting member is made of metal.

23. A mounting member as in claim 17 or 18 wherein said mounting member is made of plastic.

24. An enclosure for an electrical device having at least one printed circuit board, comprising:
first and second housing members cooperating to define the enclosure for the electrical device;
at least two mounting members for joining said first and second housing members by providing rigid support thereto and holding said printed circuit board at a predetermined position between said first and second housing members, each mounting member extended from said first housing member and including means adapted to cooperate with means associated with said circuit board for holding said circuit board at said predetermined position; and
means for attaching said second housing member to said mounting members wherein each mounting member comprises:
an elongated main body portion having spaced-apart irregularities formed therealong for mating with irregularities in the outer edges of said printed circuit board, and
attachment means for physically securing said main body portion to said first and second housing members.

25. An enclosure as in claim 24 wherein said main body portion comprises a substantially rectangular body of metal having pairs of opposing notches formed in outer edges thereof at locations spaced therealong.

26. An enclosure as in claim 24 or 25 wherein said attachment means comprises two threaded apertures.

27. An enclosure as in claim 26 wherein said elongated main body portion includes a right angle bent section at one end, wherein one of said threaded apertures is located within said main body portion between said spaced-apart irregularities and wherein another of said threaded apertures is located in said right-angle bent section.

28. An enclosure for an electrical device having at least one printed circuit board, comprising:
first and second housing members cooperating to define the enclosure for the electrical device;
at least two mouting members for joining said first and second housing members by providing rigid support thereto and holding said printed circuit board at a predetermined position between said first and second housing members, each mounting member extended from said first housing member and including means adapted to cooperate with means associated with said circuit board for holding said circuit board at said predetermined position; and
means for attaching said second housing member to said mounting members wherein each mounting member comprises:
a stem portion dimensioned to be secured to and extended from the first housing member, the width of the stem portion having notched tabs therealong, the length of which notches are substantially the same as the thickness of the printed circuit board, said notches of said tabs cooperating with said circuit board for holding said circuit board at said predetermined position; and
a flange portion extending perpendicularly from said step portion for attachment to said second housing member.

29. An enclosure for an electrical device having at least one printed circuit board, comprising:
first and second housing members cooperating to define the enclosure for the electrical device;
at least two mounting members for joining said first and second housing members by providing rigid support thereto and holding said printed circuit board at a predetermined position between said first and second housing members, each mounting member extended from said first housing member and including means adapted to cooperate with means associated with said circuit board for holding said circuit board at said predetermined position; and means for attaching said second housing member to said mounting members wherein each mounting member comprises:

a stem portion dimensioned to be secured to and extend from the first housing member, the width of the stem portion having notches therealong, the length of which notches is substantially equal to the notched width of said stem for holding said circuit board in a predetermined position; and a flange portion extending at an angle from said stem portion for attachment to said second housing member.

30. An enclosure as in claim 28 or 29 wherein the flange portion includes a threaded hole for facilitating the attachment of the second housing member.

31. An enclosure as in claim 28 or 29 wherein the stem portion includes a threaded hole for facilitating attachment to the first housing member.

32. An enclosure as in claim 28 or 29 including a plurality of pairs of notches spaced apart along said stem for holding a plurality of circuit boards in a predetermined spaced relationship.

33. A mounting member as in claim 28 or 29 wherein said mounting member is made of metal.

34. A mounting member as in claim 28 or 29 wherein said mounting member is made of plastic.

* * * * *